(12) United States Patent
Cheng et al.

(10) Patent No.: US 10,541,253 B2
(45) Date of Patent: Jan. 21, 2020

(54) FINFETS WITH VARIOUS FIN HEIGHT

(71) Applicant: INTERNATIONAL BUSINESS MACHINES CORPORATION, Armonk, NY (US)

(72) Inventors: Kangguo Cheng, Schenectady, NY (US); Terence B. Hook, Jericho, VT (US); Xin Miao, Guilderland, NY (US); Balasubramanian Pranatharthiharan, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/147,801

(22) Filed: Sep. 30, 2018

(65) Prior Publication Data
US 2019/0035816 A1 Jan. 31, 2019

Related U.S. Application Data

(62) Division of application No. 15/403,055, filed on Jan. 10, 2017, now Pat. No. 10,134,760.

(51) Int. Cl.
*H01L 29/06* (2006.01)
*H01L 21/8238* (2006.01)
(Continued)

(52) U.S. Cl.
CPC .... *H01L 27/1211* (2013.01); *H01L 21/02236* (2013.01); *H01L 21/02532* (2013.01); *H01L 21/3081* (2013.01); *H01L 21/30604* (2013.01); *H01L 21/76224* (2013.01); *H01L 21/76283* (2013.01); *H01L 21/823821* (2013.01); *H01L 21/823828* (2013.01); *H01L 21/823878* (2013.01); *H01L 21/845* (2013.01); *H01L 27/0922* (2013.01); *H01L 27/0924* (2013.01); *H01L 27/1104* (2013.01);
(Continued)

(58) Field of Classification Search
None
See application file for complete search history.

(56) References Cited

U.S. PATENT DOCUMENTS 7,544,994 B2   6/2009 Schepis et al.
8,101,994 B2   1/2012 Yu et al.
(Continued)

OTHER PUBLICATIONS

List of IBM Patents or Applications Treated as Related.

*Primary Examiner* — Charles D Garber
*Assistant Examiner* — Xiaoming Liu
(74) *Attorney, Agent, or Firm* — Intelletek Law Group, PLLC; Gabriel Daniel, Esq.

(57) ABSTRACT

A method of forming a semiconductor circuit having Fin-FET devices that have fins of different height is provided. There is a shallow trench isolation layer (STI) on top of a semiconductor substrate. A first Fin Field Effect Transistor (FinFET) comprises a first semiconductor fin including a first layer that extends from a common substrate level through the STI layer to a first height above a top surface of the STI layer. There is a second FinFET comprising a second semiconductor fin including the first layer that extends from the common substrate level through the STI layer to the first height above the top surface of the STI layer, plus a second layer having a second height, plus a third layer having a third height. The second semiconductor fin is taller than the first semiconductor fin.

20 Claims, 7 Drawing Sheets

(51) Int. Cl.

| | | |
|---|---|---|
| *H01L 27/12* | (2006.01) | |
| *H01L 27/11* | (2006.01) | |
| *H01L 27/092* | (2006.01) | |
| *H01L 21/84* | (2006.01) | |
| *H01L 21/02* | (2006.01) | |
| *H01L 21/306* | (2006.01) | |
| *H01L 21/762* | (2006.01) | |
| *H01L 29/66* | (2006.01) | |
| *H01L 21/308* | (2006.01) | |
| *H01L 29/78* | (2006.01) | |

(52) U.S. Cl.
CPC .... *H01L 29/0649* (2013.01); *H01L 29/66545* (2013.01); *H01L 29/785* (2013.01)

(56) References Cited

U.S. PATENT DOCUMENTS

| | | |
|---|---|---|
| 8,361,894 B1 | 1/2013 | Hargrove et al. |
| 8,441,074 B2 | 5/2013 | Rachmady et al. |
| 8,941,153 B2 | 1/2015 | Lee et al. |
| 9,087,725 B2 | 7/2015 | Lee et al. |
| 9,324,792 B1 | 4/2016 | Cao et al. |
| 2008/0128797 A1 | 6/2008 | Dyer et al. |
| 2015/0129980 A1 | 5/2015 | Wang et al. |
| 2015/0145048 A1 | 5/2015 | Cheng et al. |
| 2015/0270341 A1 | 9/2015 | Yin et al. |
| 2015/0311212 A1 | 10/2015 | Ching et al. |

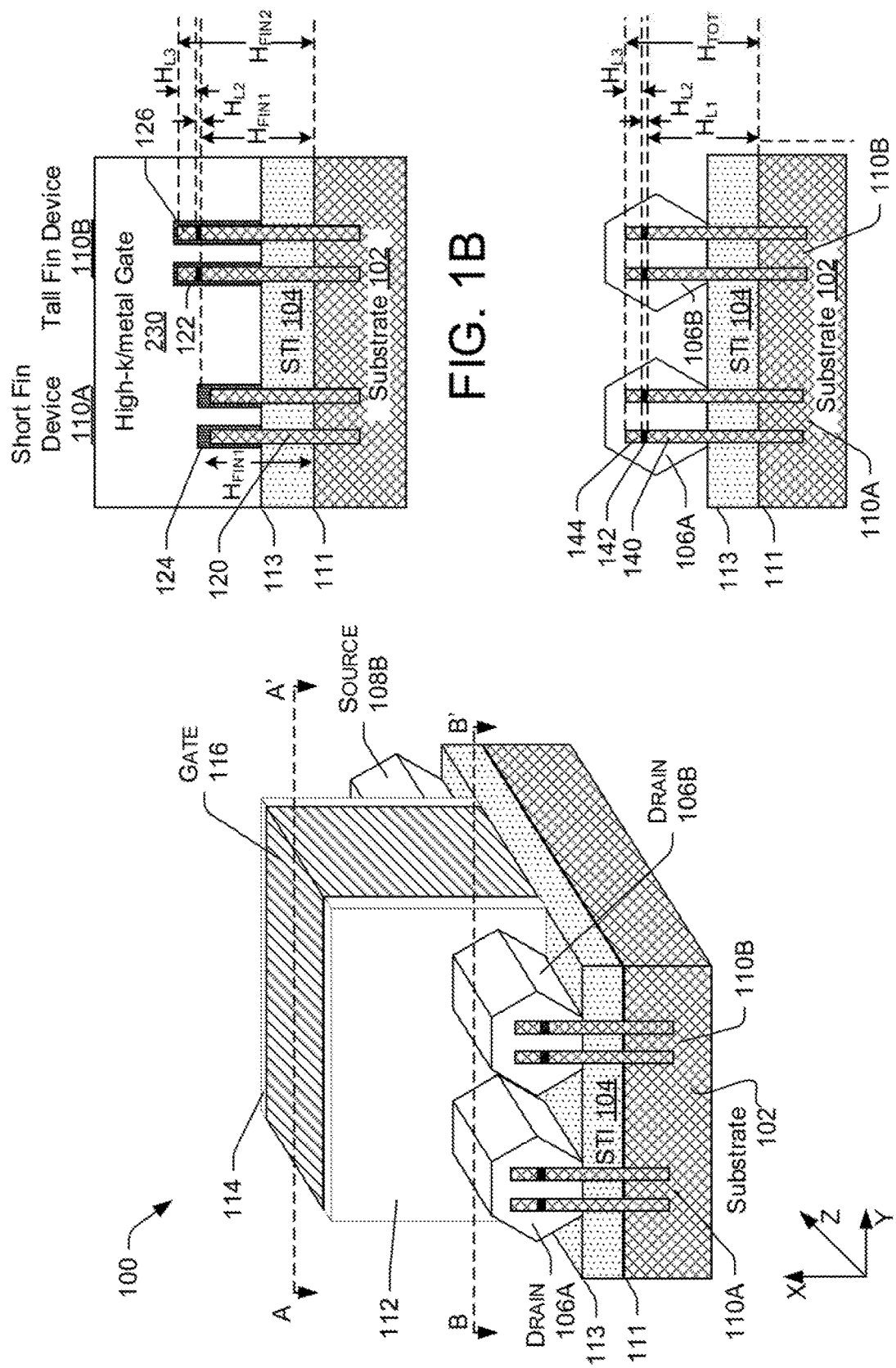

FINFETS WITH VARIOUS FIN HEIGHT

BACKGROUND

Technical Field

The present application generally relates to integrated circuits, and more particularly, to semiconductor fins and Fin Field Effect Transistors (FinFETs) and methods for forming the same.

Description of the Related Art

Performance demand for semiconductor transistors have been steadily increasing while their dimensions have shrunk. In this regard, field effect transistors (FETs) have experienced a substantial increase in performance and a planar miniaturization. Such structures typically include a source, a drain, a channel that is positioned between the source region and the drain region, and a gate positioned above the channel region. Current flow through the device is controlled by controlling a voltage applied to the gate electrode. Ideally, if there is no voltage applied to the gate electrode, then there is no current flow through the device. When an appropriate voltage is applied to the gate electrode, the channel region becomes conductive, and electrical current is permitted to flow between the source region and the drain region through the conductive channel region.

To improve the performance of the FET and to increase its density, the size of the device has been steadily reduced. More specifically, the channel length (i.e., between the drain and the source) has been dramatically reduced over the years, which has substantially improved performance. In some scenarios, the reduced channel length may result in short channel effects, which degrades the threshold behavior of these devices.

To alleviate at least some of the foregoing concerns, Fin Field-Effect Transistors (FinFETs) were developed. In contrast to the planar FET, a FinFET operates as a 3-dimensional structure, where the conducting channel is wrapped by a thin silicon "fin" that forms the body of the device. The thickness of the fin (measured in the direction from source to drain) determines the effective channel length of the device. The wrap-around gate structure provides a better electrical control over the channel, and thus, helps to reduce the leakage current and overcome the short-channel effects.

FinFETs typically have a discrete number of fins. The conventional way to adjust the device width of a FinFET is to add or delete fins in the channel. Put differently FinFETs have quantized device width. In many circuit applications, it may be advantageous to adjust the device width beyond the traditional limitation of integral numbers. In various applications, the optimal device width ratio between a P-channel FET (PFET) and an N-channel FET (NFET) may vary. For example, for a static random access memory (SRAM), the device width ratio may be approximately 0.20, which is not readily achieved by conventional FinFET structures.

SUMMARY

According to various embodiments, an integrated circuit is provided that includes FinFET devices that have fins of different height. There is a shallow trench isolation layer (STI) on top of a semiconductor substrate. A first Fin Field Effect Transistor (FinFET) comprises a first semiconductor fin including a first layer that extends from a common substrate level through the STI layer to a first height above a top surface of the STI layer. There is a second FinFET comprising a second semiconductor fin including the first layer that extends from the common substrate level through the STI layer to the first height above the top surface of the STI layer, plus a second layer having a second height, plus a third layer having a third height. The second semiconductor fin is taller than the first semiconductor fin.

In one embodiment, the first layer is silicon (Si), the second layer is oxide, and the third layer is an epitaxial layer of Si.

In one embodiment, the integrated circuit further comprises a metal surrounding each fin in a gate region of the integrated circuit to form a common gate for the first FinFET and the second FinFET.

In one embodiment, a total height of the first semiconductor fin comprises a height of the first layer, whereas a total height of the second semiconductor fin comprises a sum of the height of the first layer, the height of the second layer, and a height of the third layer.

According to one exemplary embodiment, a method of forming a semiconductor circuit having FinFET devices that have fins of different height is provided. A SiGe layer is formed above a substrate. A second layer is deposited on top of the SiGe layer. A hard mask is deposited in regions where the fins are to be constructed for a first FinFET device in a first region, and a second FinFET device in a second region of the semiconductor circuit. In regions that are not protected by the hard mask, the second layer, the SiGe layer, and part of the substrate are removed. A shallow trench isolation (STI) layer over the substrate in the regions that are not protected by the hard mask is formed. The hard mask is then stripped. Selective oxidation is performed to convert the SiGe layer of each fin into an oxide layer. A low-k dielectric liner is deposited around the fins. One or more dummy gates are formed by depositing a poly-silicon over the semiconductor circuit and spacers are created for each gate. Source and drain epitaxy is then performed, which is followed by interlayer dielectric deposition coating the entire structure. The poly-silicon is selectively removed from the first region, while maintaining the poly-silicon for the second region. The second layer is removed from the top of a fin of the first FinFET device. The oxide layer that was converted from the SiGe layer, is removed from the top of the fin of the first FinFET device. The poly-silicon is removed from the second region and the low-k dielectric liner from the first region and the second region. A gate is formed in both the first region and the second region. Consequently, a height of the second FinFET device is higher than a height of the first FinFET device.

By virtue of using FinFET structures and methods discussed herein, more precise control of the aspect ratios of transistors can be achieved, which lends itself to various integration applications. These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 1A illustrates a perspective view of a semiconductor device having FinFET structures with different fin height (i.e., device width), consistent with an exemplary embodiment.

FIG. 1B illustrates a cutaway view of the gate region of the semiconductor device of FIG. 1A, consistent with an exemplary embodiment.

FIG. 1C, illustrates a cutaway view of the drain region of the semiconductor device of FIG. 1A, consistent with an exemplary embodiment.

DETAILED DESCRIPTION

Figure 2A:
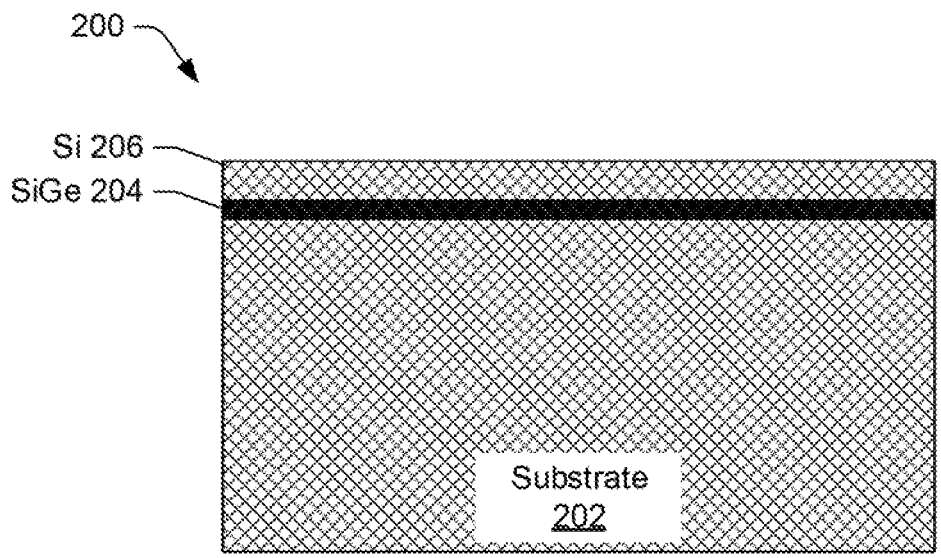
FIG. 2A illustrates an illustrative view of the semiconductor device of FIG. 1A at an early stage of manufacturing.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The present disclosure generally relates to devices and methods of forming FinFET semiconductor devices having different fin heights. The concepts discussed herein can be used in different devices and applications, including without limitation, memory devices, logic devices, processors, etc. By virtue of using FinFET structures discussed herein, more precise control of the aspect ratios of transistors can be achieved, which lends itself to various integration applications. The techniques described herein may be implemented in a number of ways. With reference to the attached drawings, various illustrative embodiments of the methods and devices disclosed herein will now be described in more detail.

FIG. 1A illustrates a perspective view of a semiconductor device 100 having FinFET structures with different device width (sometimes referred to herein as fin height), consistent with an exemplary embodiment. As described more fully below, the methods and devices disclosed herein may be formed in and above bulk substrates 102 such as Si and/or silicon on insulator (SOI) substrates. In the illustrative example depicted in FIG. 1A, the semiconductor device 100 is depicted as being on a Si substrate 102, while it will be understood that other types as substrates may be used as well, including, without limitation, silicon dioxide, aluminum oxide, sapphire, germanium, gallium arsenide (GaAs), an alloy of silicon and germanium, or indium phosphide (InP). In various embodiments, the substrate 102 may be over a SOI layer (not shown) to prevent leakage and to improve device performance. Accordingly, as used herein, the term substrate includes all forms of semiconductor structures.

In the example of FIG. 1A, the semiconductor device 100 includes a Si substrate 102 layer with a shallow trench isolation (STI), sometimes referred to as a box insulation layer 104, on top of the substrate layer 102. There is a first FinFET 110A on the left and a second FinFET 110B on the right side of the semiconductor device 100. Each FinFET 110A and 110B may have one or more semiconductor fins. Each fin extends from its drain (e.g., 106B) to its corresponding source (e.g., 108B) (i.e., into the Z direction of FIG. 1A). Put differently, fin(s) 110A extend from the drain 106A through the spacer 112, gate 116, and spacer 114 to source 108A (not shown). Similarly, fin(s) 110B extend from the drain 106B through the spacer 112, gate 116, and spacer 114 to source 108B.

In the example of FIG. 1A, the semiconductor device 100 includes a heavily doped epitaxy region (i.e., represented by the hexagonal structures) for each drain and source; the epitaxy regions may have built-in stressor to enhance performance. In various embodiments, these epitaxy regions may be of silicon (Si), silicon germanium (SiGe), germanium (Ge) or silicon carbon (SiC), or any other suitable material.

The gate 116 of the semiconductor device 100 provides superior control over each channel of the fin because it surrounds the channel, as illustrated in more detail in subsequent figures. Accordingly, the wrap-around gate 116 structure provides electrical control over the channel that is formed between the drain 106A/B and source 108A/B of each semiconductor device (i.e., left and right) and therefore aids in reducing leakage current and overcoming other short-channel effects. In various embodiments, both the left FinFET 110A and the right FinFET 110B may share a same gate 116 (as illustrated in FIG. 1A), or each FinFET may have a separate gate to provide individual electrical control over the channel of the corresponding FinFET. Further, in various embodiments, the short FinFET device 110A and the tall FinFET device 110B may be of the same or different type (e.g., both may be NFET or PFET, or one may be a PFET while the other one is an NFET).

Reference now is made to FIG. 1B, which illustrates a cutaway view (A-A') of the gate 116 region of the semiconductor device 100 of FIG. 1A. FIG. 1B illustrates the semiconductor substrate 102, with the STI on top of the semiconductor substrate 102. There is a first FinFET 110A on the left and a second FinFET 110B on the right side of the semiconductor device. The first FinFET includes at least one semiconductor fin (i.e., two are displayed in FIG. 1B by way of example only, not by way of limitation). The first semiconductor fin(s) have a structure comprising a first layer 120 that extends from a common substrate level 111, through the STI layer 104, to a first height $H_{FIN1}$ above a top surface of the STI layer. Thus, the recess depth of the STI layer 104 for the first FinFET 110A is the same as the recess depth of the second FinFET 110B. In some embodiments, the first layer 120 is Si and/or substantially of the same material as the substrate 102.

In contrast, FIG. 1B illustrates that the second semiconductor fin(s) are taller in the gate region. In particular, the second semiconductor fin(s) have a structure comprising the first layer 120 that extends from the common substrate level 111, through the STI layer 104, to a first height $H_{FIN1}$ above a top surface of the STI layer 113, plus a second layer 122 having a second height $H_{L2}$, plus a third layer 126, having a height $H_{L3}$. Accordingly, the height of the second semiconductor fin(s) have a total height $H_{FIN2}$ is provided by equation 1 below:

$$H_{FIN2}=H_{FIN1}+H_{L2}+H_{L3} \qquad (Eq. 1)$$

where, $H_{FIN1}$ is the height of the first layer 120, which is the same as the height of the fin of the short fin device 110A,
$H_{L2}$ is the height of the second layer 122, and
$H_{L3}$ is the height of the third layer 126.

In some embodiments, the second layer 122 (i.e., having height $H_{L2}$) is an oxide layer. The purpose/function of this oxide layer is discussed in more detail later in the context of a discussion of a process of manufacture of the semiconductor device 100.

The third layer 126 (i.e., having height $H_{L3}$) may be of the same material as the first layer 120 (e.g., Si). In some embodiments, there is a fourth layer 124 over regions of each fin that extend above the STI layer 104. This fourth layer 124 may be a dielectric layer that is configured to provide a barrier between the fin that is above the STI layer 104 region and the subsequent layer 230.

In various embodiments, the layer 124 may include oxide and a high-k dielectric. The subsequent layer 230 may include a work-function metal and an electrode metal.

FIG. 1C, illustrates a cutaway view (B-B') of the drain region (e.g., 106A and 106B) of the semiconductor device 100 of FIG. 1A. It should be noted that a cutaway view of the source region (e.g., 108A and 108B) is substantially similar and therefore not repeated here for brevity.

In the example of FIG. 1C, the drain region of the semiconductor device 100 includes a Si substrate layer 102 with an STI layer 104 thereon. The top of the substrate layer 102 has a level 111 that is common with the gate region. Similarly, the top of the STI layer 104 has a level 113 that is approximately common with the gate region. Put differently, the STI layer 104 has an approximately common thickness in the source, drain, and gate region of the semiconductor device 100.

There is a first FinFET 110A on the left and a second FinFET 110B on the right side of the semiconductor device 100. The drain (as well as the source) of the semiconductor device 100 includes a doped epitaxy region (i.e., represented by the hexagonal structures) that surrounds the top portion of each fin, accordingly. More particularly, each epitaxy region covers the region of the fin that is immediately above the STI layer 104.

In one embodiment, the height of the first FinFET 110A is substantially similar to that of the second FinFET 110B in the drain and source region of the semiconductor device 100.

In particular, the semiconductor fin(s) at the drain and source region each have a structure comprising a first layer 140 that extends from the common substrate level 111, through the STI layer 104, to a first height $H_{L1}$ above a top surface of the STI layer 113, plus a second layer 142 having a second height $H_{L2}$, plus a third layer 144, having a height $H_{L3}$. Accordingly, the height of the semiconductor fin(s) in the drain and source regions each have a total height $H_{TOT}$ that is provided by equation 2 below:

$$H_{TOT}=H_{L1}+H_{L2}+H_{L3} \qquad (Eq. 2)$$

In some embodiments, the first layer 140 is the same as the first layer of the fins in the gate region and the height $H_{L1}$ is the same height as $H_{FIN1}$ of the gate region. Put differently, $H_{TOT}$ of the drain and source regions is equal to $H_{FIN2}$ of the gate region.

Example FinFET Device Fabrication

With the foregoing overview of the structure of the semiconductor device 100 having FinFET structures of different height, it may be instructive to describe the fabrication process thereof. To that end, FIGS. 2A to 2K illustrates processing steps of the FinFET semiconductor device 100 of FIG. 1, consistent with exemplary embodiments.

FIG. 2A illustrates an illustrative view of a semiconductor device 200 at an early stage of manufacturing. The semiconductor device 200 includes a substrate layer 202. For discussion purposes, it will be assumed that the substrate 202 is Si, while it will be understood that other types as substrates may be used as well, including, without limitation, silicon dioxide, aluminum oxide, sapphire, germanium, gallium arsenide (GaAs), an alloy of silicon and germanium, or indium phosphide (InP). The substrate 202 provides the basis on which FinFET devices with different heights are formed. Traditional processing steps may be used to grow a silicon germanium epitaxial layer 207 on top of the substrate 202. In one example, where the substrate is SiGe, an additional SiGe layer 207 need not be grown. Subsequently, an Si layer 206 is grown on top of the SiGe layer 207.

Figure 2B:
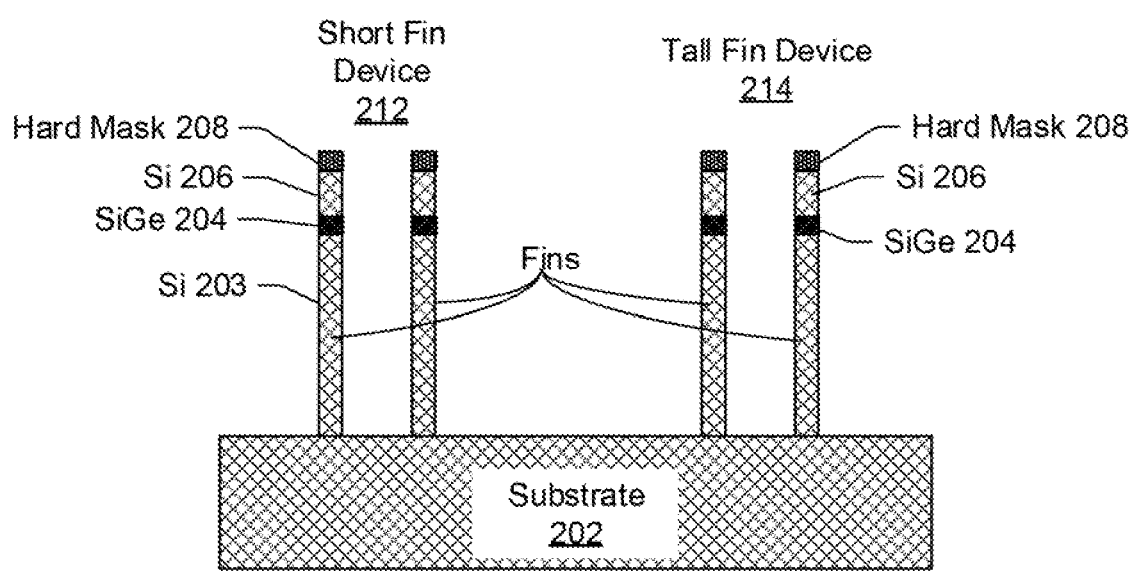
FIG. 2B illustrates the deposition of a hard mask on top of a silicon layer, consistent with an exemplary embodiment.

A hard mask 208 is deposited on top of the Si layer 206. This hard mask 208 will make possible for the different layers that are not covered by the hard mask 208 to be etched into to the substrate layer, as illustrated in FIG. 2B. Such patterned hard mask layer 208 or a photoresist mask, can be formed above the Si layer 206 using known photolithography and etching techniques. In various embodiments, the hard mask layer 208 may include a variety of materials, such as, for example, a photoresist material, silicon nitride, nitride, oxynitride, etc. Further, the hard mask layer 208 may comprise multiple layers of material such as, a pad oxide layer that is formed on the Si layer 206. Thus, the particular form and composition of the patterned mask layer 12, and the manner in which it is made, should not be considered a limitation of the present disclosure. For example, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

For example, dry etch and/or reactive ion etch (RIE) may be used to perform a cut, where portions of the semiconductor material that are not below the hard mask 208 are selectively removed. The material that is not protected by the hard mask 208 may be removed by exposing the material to a bombardment of ions (e.g., a plasma of reactive gases such as fluorocarbons, oxygen, chlorine, boron trichloride; with addition of nitrogen, argon, helium and/or other gases)

that dislodge portions of the material from the exposed surface. In one embodiment, a sidewall image transfer process (SIT) is used for better precision. It is believed that such processes are generally known to those skilled in the art and are therefore not discussed here in detail for brevity.

Figure 2C:
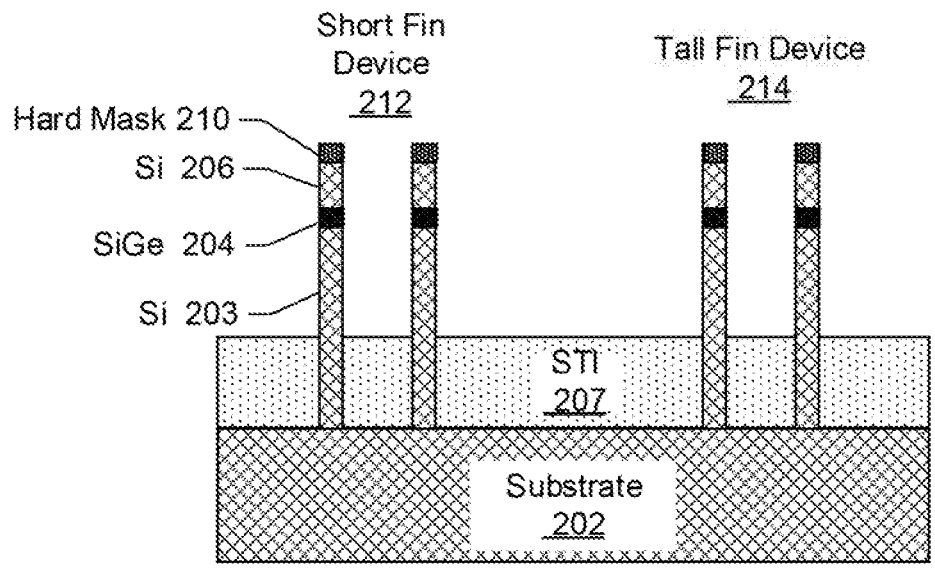
FIG. 2C illustrates a layer of shallow trench isolation being deposited, consistent with an exemplary embodiment.

FIG. 2C illustrates a layer of STI 207 being deposited. In one embodiment, the STI layer reaches a height of (or above) the hard mask layer 210. A chemical mechanical polishing/planarization (CMP) step is performed to remove the STI to a level of the hard mask 210. The STI 207 is then recess etched (where the STI is etched down to a desired height, which is below the SiGe layer 204 region).

Figure 2D:
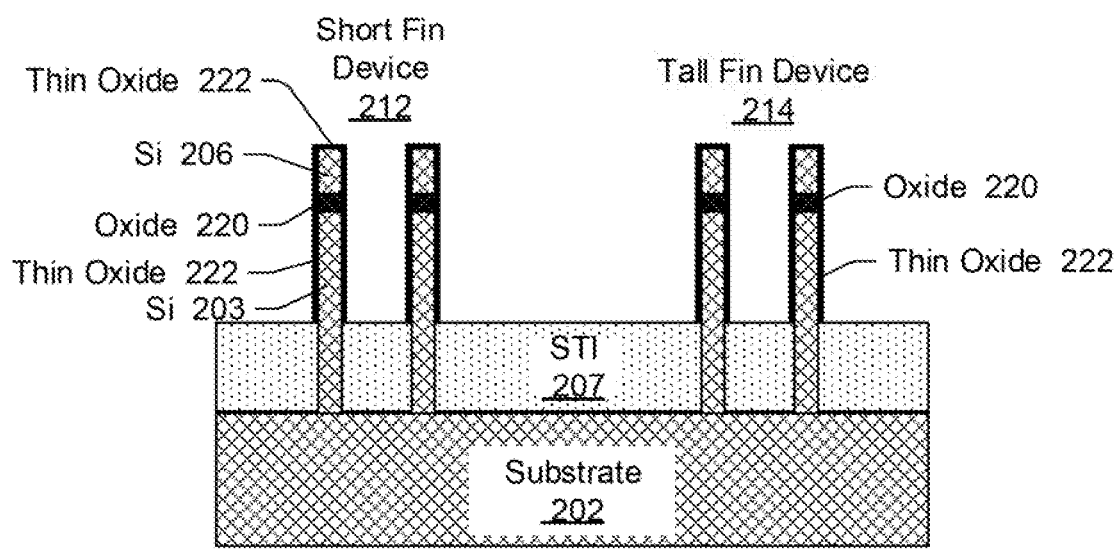
FIG. 2D illustrates the hard mask layer being is stripped away via an etching process, consistent with an exemplary embodiment.

Next, as shown in FIG. 2D, the hard mask (i.e., hard mask 210 of FIG. 2C) is stripped away via an etching process. Subsequently, selective oxidation (i.e., oxidize SiGe faster than Si) is performed, which converts the SiGe layer 204 of FIG. 2C into an oxide layer 220. Additionally, a thin layer of oxide 222 (much thinner than the oxide layer 220 because of selective oxidation) is also formed on the silicon surfaces of each fin. The thin oxidation 222 may be viewed as a byproduct of the selective oxidation of the oxide layer 220.

Figure 2E:
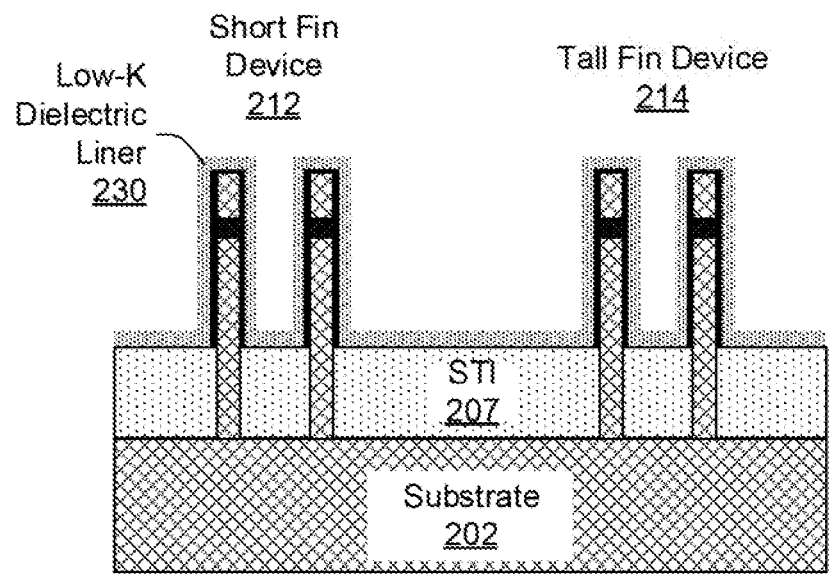
FIG. 2E illustrates a thin layer of a liner being deposited around the fins and the exposed surface of the shallow trench isolation layer, consistent with an exemplary embodiment.

Next, as shown in FIG. 2E, a thin layer of a (e.g., low-k dielectric) liner is deposited around the fins and the exposed surface of the STI layer 207. In one embodiment, an atomic layer deposition technique is used, where a thin film of low-k dielectric liner 230 is deposited based on a sequential use of a gas phase chemical process. Other suitable chemical vapor deposition techniques may be used as well. For example, this dielectric liner 230 may be used to protect the fin surfaces during this processing step, as illustrated in FIG. 2H. The fin surface quality is salient for carrier mobility and transistor performance.

Figure 2F:
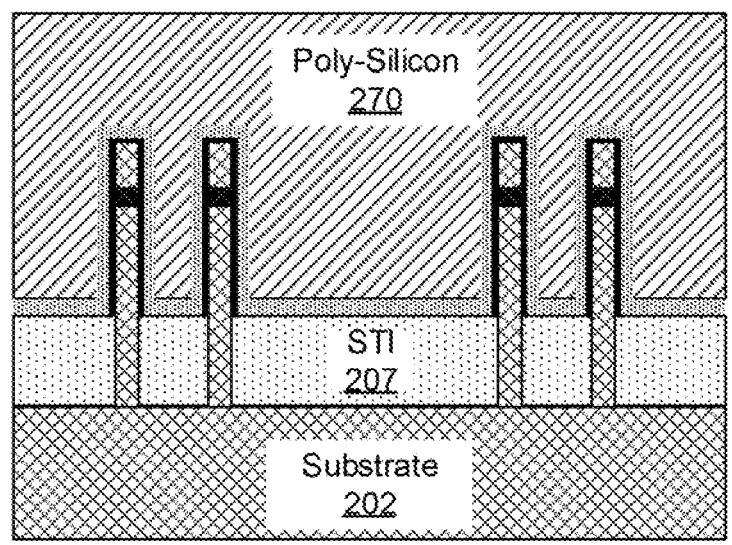
FIG. 2F illustrates a deposition of a pattern of poly-silicon on the semiconductor device at predetermined regions, to form one or more dummy gates, consistent with an exemplary embodiment.

FIG. 2F illustrates a deposition of a pattern of poly-silicon on the semiconductor device at predetermined regions, to form one or more dummy gates. In this regard, it is noted that spacers may be created beside the dummy gates (not shown in the cross section of FIG. 2F but illustrated as elements 112 and 114 in FIG. 1A). The term "dummy gates" is used to indicate that these structures will later be converted to high-k/metal gates. Put differently, the poly-silicon layer 270 creates a structure that functions as a place-holder for the later high-k/metal gate.

For example, the poly-silicon layer 270 may be deposited on the entire wafer that includes the semiconductor device 100. Subsequently, it is patterned into appropriate stripes from left to right. A dielectric (e.g., nitride or other low-k dielectrics) is deposited on the entire structure (not shown) to form spacers beside the dummy gates. The remaining structure of the poly-silicon layer 270 is converted into a real metal gate stack in a subsequent step. Source and drain epitaxy is then performed (not shown) and followed by an interlayer dielectric deposition coating the entire structure (not shown).

Figure 2G:
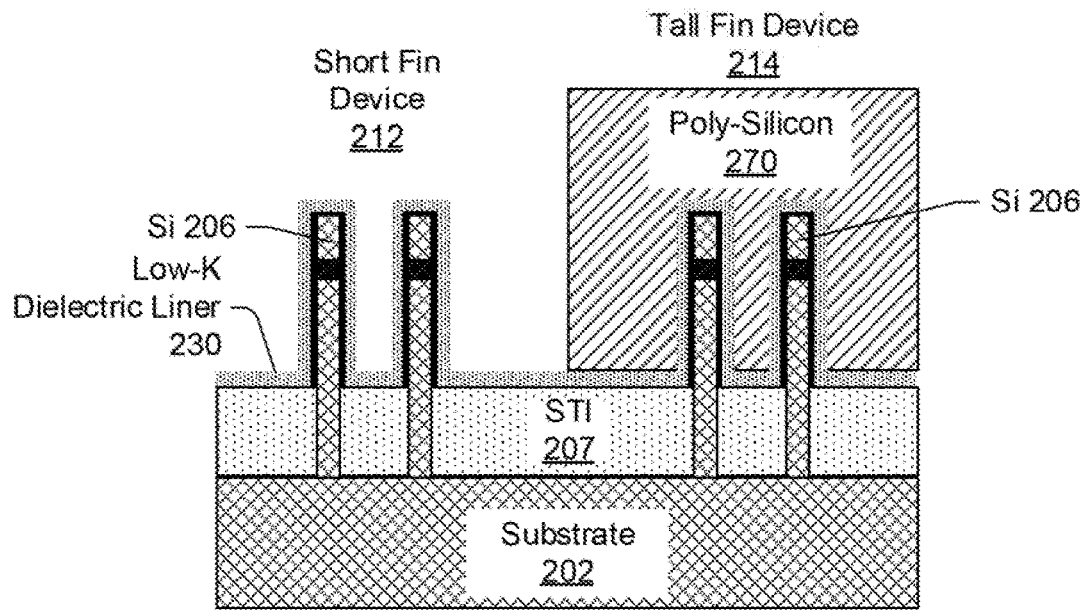
FIG. 2G illustrates an etching process being performed to selectively remove the poly-silicon from predetermined regions to reveal the fins under the dummy gate, consistent with an exemplary embodiment.
Figure 2H:
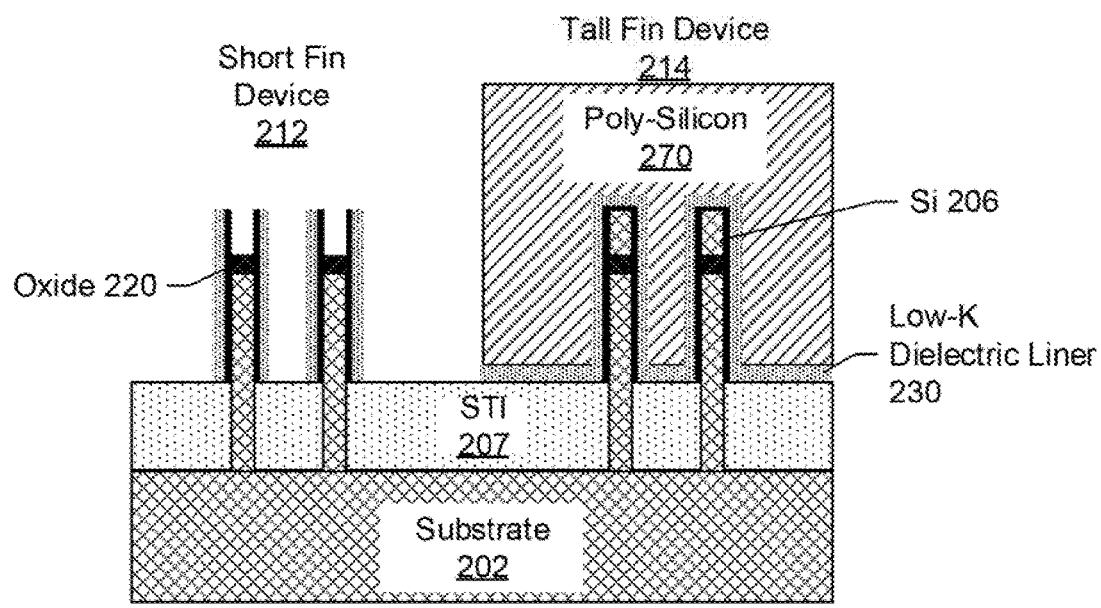
FIG. 2H illustrates a Si layer on top of a short fin device being removed, consistent with an exemplary embodiment.

Next, as shown in FIG. 2G, CMP processing may be performed to reveal the top of the dummy gate. Then, the poly-silicon from predetermined regions is removed from the gate region of the short fin device 212, while the poly-silicon layer 270 is maintained for the tall fin device 214. Notably, both the short fin device 212 and the tall fin device 214 are still protected by the dielectric liner 230.

Figure 2I:
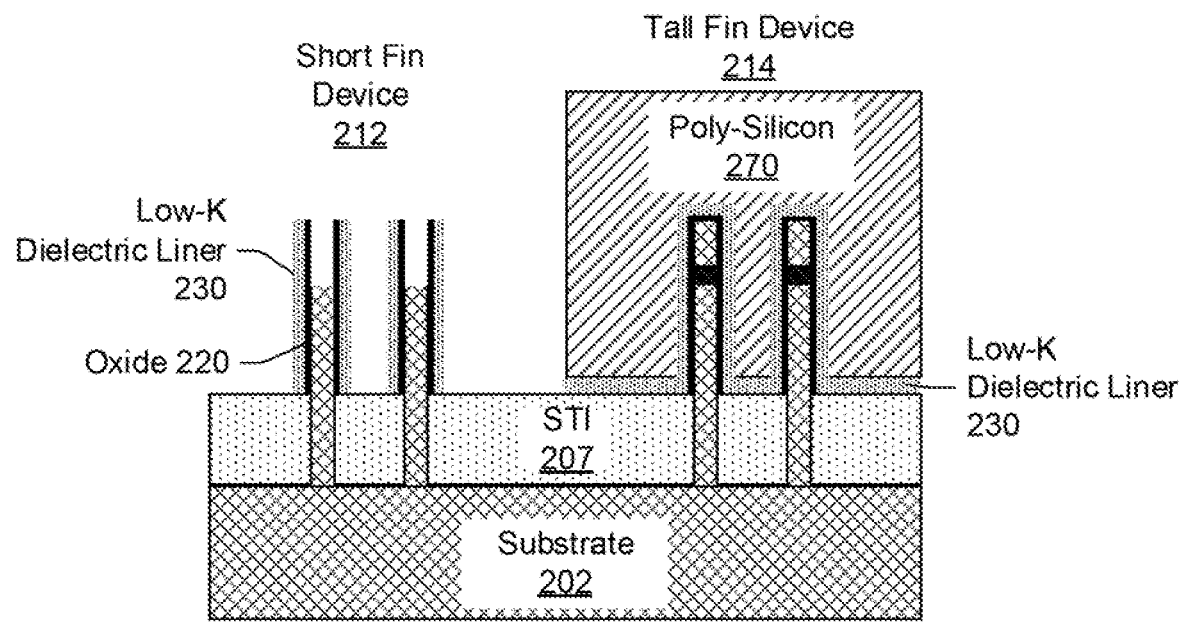
FIG. 2I illustrates an oxide layer on top of each fin of a short fin device being removed, consistent with an exemplary embodiment.

Next, as shown in FIG. 2H, the dielectric layer 230 on the exposed horizontal surfaces and the Si layer 206 on top of the short fin device 212 is removed. In one embodiment, directional (i.e., selective) RIE is performed to remove the dielectric liner 230 and the fin Si layer 206 of the short fin device 212. The oxide layer 220 on top of each fin of the short fin device 212 is then removed, as illustrated in FIG. 2I. Thus, by virtue of using the oxide layer 220, a stop layer is provided for etching, which allows the tall fin-device 214 to have fins that are taller than those of the short fin device 212.

Figure 2J:
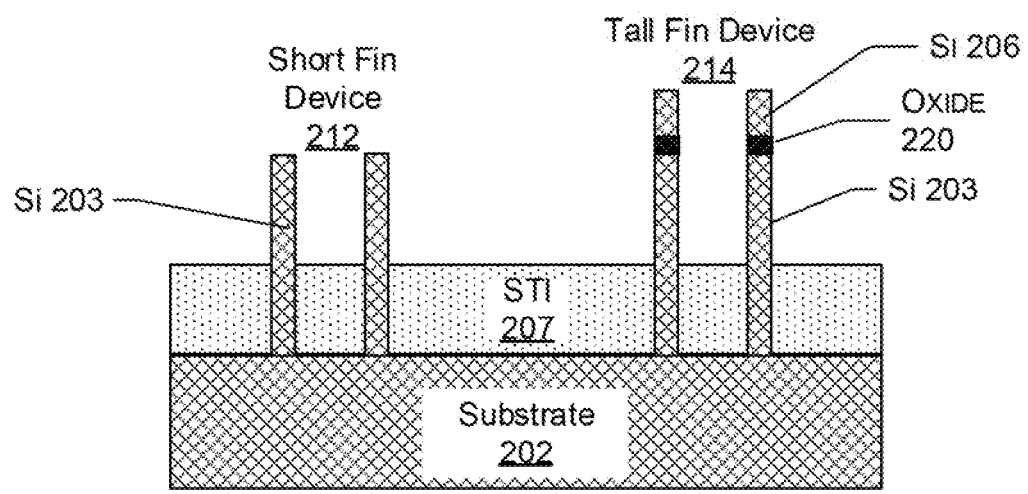
FIG. 2J illustrates a poly-silicon layer being removed, consistent with an exemplary embodiment.

Next, as shown in FIG. 2J, the poly-silicon layer 270 (which remained in the tall fin device 214 of the gate region) is removed, as well as the dielectric liner 230 and the oxide layer 222 of the all devices. Accordingly, the tall fin device 214 is taller in that it has (in addition to the silicon layer 206 portion of the fin), an additional oxide layer 220 and a third layer 206, which may be Si. In various embodiments, the height of the Si layer 206 and the ratio of the Si layer 206 to the Si layer 203 may vary, based on the particular application. In one non-limiting example, the total height of the fin (i.e., Si layer 206 plus the oxide layer 220, plus the Si layer 203) may be in the range of 10 nm to 100 nm. The height of the Si layer 206 may be 10% to 90% of the total height.

Figure 2K:
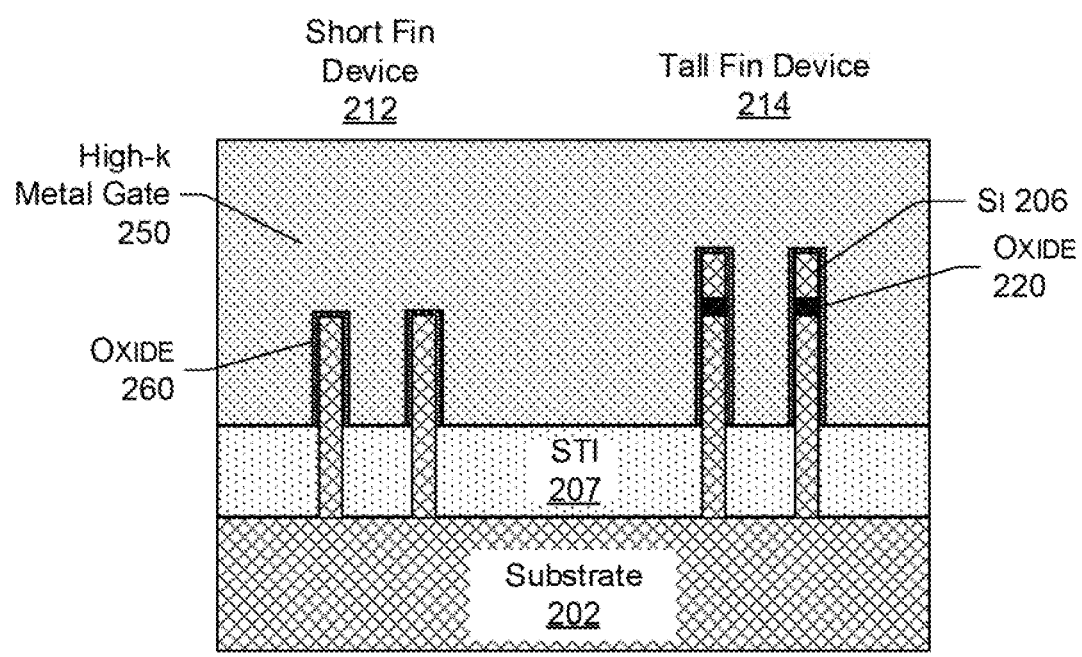
FIG. 2K illustrates a high-k or metal gate layer being deposited on top of the shallow trench isolation layer in the gate region of a semiconductor device, consistent with an exemplary embodiment.

Next, as shown in FIG. 2K, a high-k/metal gate stack is deposited on top of the STI layer 207, which covers all the fins in the gate region of the semiconductor device 100. To better passivate fins of the short fin device 212 and tall fin device 214, in some embodiments, there may be an additional layer 260 deposited or grown over regions of each fin that extend above the STI layer 207. This additional layer, which is deposited or grown before the formation of high-k/metal stack 250, may be an oxide layer. This oxide layer 260 is configured to provide a barrier between each fin portion that is above the STI 207 region and the high-k/metal gate stack 250. In various embodiments, the relative height difference between the short fin device 212 and the tall fin device 214 may vary depending upon the particular application.

By providing different fin heights for different regions of a semiconductor device 100, the FinFETs of a semiconductor device are no longer tied to a quantized device width. Accordingly, it is easier to adjust the performance of devices in different regions of a semiconductor device 100. In a non-limiting example, the short fin device 212 may be an NFET and the tall fin device may be a PFET that may be used together in a static random access memory (SRAM) cell. In this regard, the height of the tall fin device 214 may be adjusted such that the appropriate pull-up time (i.e., via the PFET) is achieved with respect to the pull-down time (i.e., via the NFET). The performance of the SRAM cell can thereby be optimized while maintaining a small form-factor.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to process flow illustrations and/or block diagrams of a method, semiconductor device, and system according to embodiments of the present disclosure. It will be understood that each step of the process flow illustrations and/or block diagrams, and combinations of blocks in the process flow illustrations and/or block diagrams, can be implemented or controlled by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the process and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the process flow and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the process and/or block diagram block or blocks.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method of forming a semiconductor circuit having FinFET devices having fins of different height, the method comprising:
    forming a SiGe layer above a substrate;
    depositing a second layer on top of the SiGe layer;
    depositing a hard mask in regions where the fins are to be created for a first FinFET device in a first region and a second FinFET device in a second region;
    removing the second layer, the SiGe layer, and part of the substrate in regions that are not protected by the hard mask;
    forming a shallow trench isolation (STI) layer over the substrate in the regions that are not protected by the hard mask;
    stripping away the hard mask;
    performing selective oxidation to convert the SiGe layer of each fin into an oxide layer;
    depositing a low-k dielectric liner around the fins;
    forming one or more dummy gates by depositing a poly-silicon over the semiconductor circuit and creating spacers for each gate;
    selectively removing the poly-silicon from the first region, while maintaining the poly-silicon for the second region;
    removing the second layer from the top of a fin of the first FinFET device;
    removing the oxide layer that was converted from the SiGe layer, from the top of the fin of the first FinFET device;
    removing the poly-silicon from the second region and the low-k dielectric liner from the first region and the second region; and forming a gate in both the first region and the second region, wherein a height of the second FinFET device is higher than a height of the first FinFET device.

2. The method of claim 1, wherein the substrate is silicon (Si).

3. The method of claim 1, wherein the semiconductor substrate is one of (i) silicon dioxide, (ii) aluminum oxide, (iii) sapphire, (iv) germanium, (v) gallium arsenide (GaAs), (vi) an alloy of silicon and germanium, and (vii) indium phosphide (InP).

4. The method of claim 1, wherein the hard mask is a nitride.

5. The method of claim 1, wherein the fin of the second FinFET device comprises a first layer comprising Si.

6. The method of claim 5, wherein the fin of the second FinFET device comprises a second layer comprising oxide.

7. The method of claim 6, wherein the fin of the second FinFET device comprises a third layer comprising Si.

8. The method of claim 1, wherein the semiconductor substrate is over a silicon on insulator (SOI) layer.

9. The method of claim 1, further comprising providing a high-k dielectric surrounding each fin in a gate region of the semiconductor circuit.

10. The method of claim 9, further comprising providing an oxide layer between each fin and the high-k dielectric surrounding each fin in the gate region of the semiconductor circuit.

11. The method of claim 1, further comprising providing a metal stack surrounding each fin in a gate region of the semiconductor circuit to form a common gate for the first FinFET device and the second FinFET device.

12. The method of claim 1, wherein the second layer is Si.

13. The method of claim 1, wherein the first FinFET device and the second FinFET device are of a same static random access memory (SRAM) cell.

14. The method of claim 1, wherein the first FinFET device is P-type and the second FinFET device is N-type.

15. The method of claim 1, wherein:
a total height of the first semiconductor fin comprises a height of the first layer;
a total height of the second semiconductor fin comprises a sum of the height of the first layer, the height of the second layer, and a height of the third layer.

16. The method of claim 1, wherein the second layer, the SiGe layer, and part of the substrate under region that are not protected by the hard mask are removed.

17. The method of claim 16, wherein the second layer, the SiGe layer, and part of the substrate under region that are not protected by the hard mask are removed by a reactive ion etch (RIE) step.

18. The method of claim 1, further comprising performing fin reveal etching after forming the STI layer.

19. The method of claim 18, wherein the second layer, the SiGe layer, and part of the substrate under region that are not protected by the hard mask are removed by a reactive ion etch (RIE) step.

20. The method of claim 1, wherein the gate is of a high-k dielectric and metal stack that surrounds each fin.

* * * * *